(12) United States Patent
Clymer

(10) Patent No.: US 11,988,700 B1
(45) Date of Patent: May 21, 2024

(54) SYSTEM AND METHOD FOR ANTENNA CALIBRATION

(71) Applicant: BAE SYSTEMS INFORMATION AND ELECTRONIC SYSTEMS INTEGRATION INC., Nashua, NH (US)

(72) Inventor: Richard E. Clymer, Concord, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 318 days.

(21) Appl. No.: 17/536,666

(22) Filed: Nov. 29, 2021

(51) Int. Cl.
*G01R 29/08* (2006.01)
*H01Q 3/26* (2006.01)

(52) U.S. Cl.
CPC ......... *G01R 29/0892* (2013.01); *H01Q 3/267* (2013.01)

(58) Field of Classification Search
CPC ............................ H01Q 3/267; G01R 29/0892
See application file for complete search history.

(56) References Cited

U.S. PATENT DOCUMENTS

2020/0309933 A1\* 10/2020 Ray ........................ H04B 1/16

FOREIGN PATENT DOCUMENTS

DE 102020111842 A1 \* 11/2020 ............. H01Q 3/267

\* cited by examiner

*Primary Examiner* — Bernarr E Gregory
*Assistant Examiner* — Fred H Mull
(74) *Attorney, Agent, or Firm* — Sand, Sebolt & Wernow LPA; Gary McFaline

(57) ABSTRACT

An antenna calibration system and method utilizes both computer electromagnetic modeling and actual test fixture measurements for calibrating the antenna or multiple antennas in an array. Use of the test fixture measurements enables the calibration technique to account for design nuances or imperfections in each respective antenna to enable that particular antenna to be more accurately modeled for calibration without having to physically maneuver the platform to calibrate the antenna that is to be installed thereon. Use of computer electromagnetic modeling techniques then account for these design nuances or imperfections to provide improved modeling for calibrating the antenna on a platform prior to moving the platform with the antennas on the platform.

19 Claims, 12 Drawing Sheets

SYSTEM AND METHOD FOR ANTENNA CALIBRATION

TECHNICAL FIELD

The present disclosure relates generally to a system and method for antenna calibration. More particularly, a new and improved system and method for calibrating direction finding antennas at reduced cost is provided.

BACKGROUND

The process of determining the direction to the source of an emitted signal, which is known as direction finding (DF), is common to many applications. For example, direction finding can be used in navigation, search and rescue, tracking wildlife, and locating illegal transmitters. In military applications, direction finding helps in target acquisition and tracking of enemy locations and movements. Nearly all modern militaries use some form of direction finding to guide their ships, aircraft, troops, and/or munitions in one or more ways. For example, direction finding is the process by which enemy emitters are detected and/or geolocated, thus providing information to military operators as to location and type of emitter being used which can further be used to identify enemy units and/or troops and the movements thereof. As military technology advances, new emitters have come online that are capable of operation in multiple frequencies of the electromagnetic spectrum and across multiple channels. These advanced emitters are capable of both broadcasting and receiving in short, non-continuous bursts and are considered to be very agile systems that may jump through frequency and dynamic ranges to evade detection while maintaining effective detection capabilities on their own. Most of these modern emitters have a low probability of intercept (LPI) and emit single short radar pulses at varying intervals in their attempts to avoid detection.

Calibrating DF antenna arrays is often necessary to ensure their proper operation. Correlation interferometry DF has become an industry standard for direction finding. With a more traditional approach, a set of antennas on a platform is used with trigonometric techniques to determine how phase differences measured at the receiving antennas align with the signal direction of arrival. These techniques work with a plurality of different antennas in different orientations in space. Historically, however, antennas were placed in a line and a theoretical approach was used to determine the phase difference based on the signal wave impinging on a line of antennas from any arbitrary angle. For example, if the signal source is broadside to the line of antennas, then the phase difference would be zero and if it was end-fire, then the phase difference would be determined by whatever the physical spacing distance between the antennas is as arranged in a line. Trigonometry could be utilized to determine the angles between a broadside source and an end-fire source. Thus, there were hard-set equations used to reverse the calculation to determine the angle and orientation of the source based on the phase differences at each of the respective antennas. A problem that arises with this is when signals reflect and propagate through a medium, or refract, or scatter, or recombine depending on the antenna installation on a platform.

A technique utilized by platforms is to calibrate the antennas by moving the platform over some large distances while radiating signals from fixed locations to observe and calibrate how the antennas receive signals relative to the platform. The platform may have many surfaces capable of scattering, or diffracting, or otherwise combining the various signals from the antenna source. For example, when the platform is a ship, the ship would be calibrated by sailing or driving the ship in large circles for many days and transmit signals from a known location and store what the measured voltages were at each respective antenna for many incident angles, wherein the voltages are functions of the amplitude and phase components of the signal. When the ship was done sailing, all of the signals would be stored in the system's computer that would allow the system to run a lookup method when an unknown source is detected at a later date to determine the angle of arrival and calculate the direction from which the signal arrived.

DF antennas must be calibrated prior to their usage and operational deployment. Calibrating DF antenna arrays on platforms can be difficult and costly. Complex direction finding platforms, such as aircraft, ships, and land vehicles or moveable structures can be costly to operate and maneuver to the many required positions in front of a transmitting DF calibration antenna. Providing high signal to noise ratio and uncorrupted signals to the DF array under calibration can be difficult due to necessary transmit distances and ground reflections. Navigation and alignment requirements can also be difficult to maintain during calibration. Significant performance degradation can be incurred due to the measurement errors associated with DF system calibration. Hundreds of hours of calibration time are often required, which, depending on the platform to be calibrated, can be prohibitive in terms of cost and schedule. Using Computer Electromagnetic Modeling (CEM) can provide responses for antennas mounted on complex three dimensional (3D) objects. Using 3D CEM can remove the large cost and schedule burdens of DF array calibration, but unfortunately the accuracy of the CEM antenna responses are often limited by the construction and design nuances of the antennas that cannot be captured by the CEM antenna models.

One exemplary problem or issue associated with this calibration method is cost and time with calibrating the antennas. One can easily understand that driving a ship in circles for days on end simply to calibrate the antennas is not an efficient use of resources.

SUMMARY

Thus, the present disclosure addresses the need to calibrate an antenna array while also balancing the need of performing the calibration in a cost effective and efficient or time-shortened manner. Notably, the antenna calibration techniques described herein can be utilized with any type of antenna, not just DF antenna arrays. Thus, although the problem arose through DF antenna calibration, the inventors have determined that the applicability of the calibration techniques of the present disclosure broadly encompasses all uses where obtaining installed antenna patterns is desired.

Previous attempts have also tried to use CEM to calibrate antennas. The problem with previous CEM techniques is that it does not contain the design nuances of each of the antennas. For example, no two antennas are exactly alike. Some antennas may have feed points with varying amounts of solder, some may have differing antenna orientation relative to its ground plane, and some be placed or mounted at near-end structures. Any deviation from a perfect norm or ideal can result in variations in the antenna's response to detect the signals. Thus, what is needed is an in situ measurement to calibrate antennas for improved accuracy while utilizing CEM techniques to minimize costs.

The present disclosure uses fixture antenna range measurements and electromagnetic modeling as an improvement over previous techniques that solely used CEM techniques to calibrate antennas. As stated previously, each antenna comes with its own nuances that must be taken into consideration during calibration. Thus, the present disclosure utilizes fixture antenna range measurements in combination with CEM techniques to more effectively calibrate an antenna or an antenna array. Typically, antennas are mounted on a plate, such as a test plate having a known diameter, for example about five feet, and tested by a manufacturer prior to delivery to a customer. The present disclosure takes advantage of fixture antenna range measurements that are normally performed by an antenna manufacturer to confirm that the antennas are operational prior to mounting on a platform. Thus, the present disclosure utilizes the techniques of mounting antennas on a known fixture used to verify that the antennas are working and use that information in combination with CEM techniques to obtain more efficient data that can be used in calibration. Thus, CEM techniques can be utilized to represent the platform and the nuances that are detected and measured during a fixture antenna range measurement can account for the antenna nuances that would ordinarily be difficult to model during calibration solely using CEM techniques. This allows the nuances of the antenna to be measured and determined but in a simple and fast way that does not require the nuances to be measured when already installed on the platform.

Due to the high costs of DF antenna array calibration. The solution is to measure the antennas that are to be installed on a platform in a simple antenna fixture. This is often done as part of an Acceptance Test Procedure (ATP) for the antennas. What these relatively simple antenna measurements contain are the inherent design and construction nuances of the antennas. Using computer electromagnetic models of the antennas installed in the simple fixture, as well as in the operational platform, complex voltage algebra of the three responses (simple fixture measurements, CEM antenna responses from the simple fixture, and CEM antenna responses from the platform) can be used to create DF array calibration data that can be equal to or more accurate than if the arrays were calibrated while installed on the platform. This solution allows for the DF accuracy to be maintained or improved upon, while greatly reducing cost and schedule impacts when compared with current approaches.

The system and method of the present disclosure achieves accurate and inexpensive DF antenna array calibration by using simple antenna measurements in conjunction with CEM antenna responses, neither of which require the use of the operational platform. The system and method of the present disclosure includes the detailed responses of the DF array antennas, which a CEM only solution does not include, while removing the schedule, cost and measurement error burdens associated with a platform calibration. The system and method of the present disclosure may also create a calibration fixture that contains enough of the platform structure to adequately represent the antenna responses, without being very complex, while precluding the requirement to operate the platform to calibrate it. One historical approach for calibrating DF arrays is to use detailed and complex calibration fixtures that attempt to include the predominant platform effects. Depending on the structures associated with the platform, there can be significant cost to building a complex test fixture, and it may or may not be able to fully represent the platform. The system and method of the present disclosure minimizes the need for complex and expensive test fixtures.

In one aspect, an exemplary embodiment of the present disclosure may provide a method for antenna calibration comprising: installing at least one antenna on a test fixture (or effecting or encouraging another to install the at least one antenna on a test fixture); measuring actual voltages of at least one antenna installed on the test fixture (or effecting or encouraging another to measure actual voltages of at least one antenna on the test fixture); predicting, via a computer electromagnetic model (CEM), voltages from of the at least one antenna installed on the test fixture; determining a ratio of the actual voltages to the predicted voltages of the at least one antenna installed on the test fixture; predicting, via the CEM, voltages from of the at least one antenna installed on a platform; multiplying the ratio of the actual voltages to the predicted voltages of the at least one antenna installed on the test fixture with the predicted voltages of the at least one antenna installed on a platform to generate calibration data of the at least one antenna; determining a calibration database of calibration data from a plurality of antennas installed on the platform, wherein the at least one antenna is from the plurality of antennas; effecting the removal of the at least one antenna from the test fixture and thereafter effecting the installation of the at least one antenna on a platform; and effecting direction finding (DF) of an angle to a signal source relative to and detected by at least some of the plurality of antennas based on the calibration database.

In another aspect, an exemplary embodiment of the present disclosure may provide a method for antenna calibration comprising: calibrating at least one antenna for use in an antenna array on a platform, wherein calibrating the at least one antenna includes executing a calibration based, at least in part, on (i) an actual antenna response voltage of the at least one antenna on a test fixture, (ii) a first predicted antenna response voltage of the at least one antenna on the test fixture, and (iii) a second predicted antenna response voltage of the at least one antenna on a modeled platform; and wherein calibrating the at least one antenna occurs prior to moving the platform with the at least one antenna installed thereon or without moving the platform after the at least one antenna is installed on the platform. This exemplary method or another exemplary method may further provide predicting, via a computer electromagnetic model (CEM), the first predicted antenna response voltage of the at least one antenna installed on the test fixture utilizing CEM inputs of a known frequency and a known location of a test signal source. This exemplary method or another exemplary method may further provide inputting a digital representation of physical characteristics of the test fixture into the CEM model prior to predicting the first predicted antenna response voltage of the at least one antenna installed on the test fixture. This exemplary method or another exemplary method may further provide determining a ratio of the actual antenna response voltage to the first predicted antenna response voltage of the at least one antenna installed on the test fixture. This exemplary method or another exemplary method may further provide predicting, via the CEM, the second predicted antenna response voltage when the at least one antenna is installed on the modeled platform. This exemplary method or another exemplary method may further provide multiplying the ratio of the actual antenna response voltage to the first predicted antenna response voltage of the at least one antenna installed on the test fixture with the second predicted antenna response voltage of the at least one antenna installed on the modeled platform to generate calibration data of the at least one antenna. This exemplary method or another exemplary method may further provide constructing a calibration database of the calibration data. This exemplary method or another exemplary method may further provide effecting the removal (i.e., causing a third-party or another to remove) of the at least one antenna from the test fixture and thereafter effecting the installation of the at least one antenna on an actual platform having a configuration similar to the modeled platform; and effecting direction finding (DF) of an angle to a signal source detected by at least some of the plurality of antennas based, at least in part, on the calibration data (i.e., causing a third-party or another to DF). This exemplary method or another exemplary method may further provide effecting DF of the angle to the signal source and may be accomplished by comparing an actual antenna response voltage on the platform to the calibration data base, and correlating the actual antenna response voltage to the calibration data (i.e., causing a third-party or another to compare the response voltages in this manner). This exemplary method or another exemplary method may further provide effecting the at least one antenna to be energized from the signal source while the platform is moving to obtain the actual antenna response voltage of the at least one antenna on the platform (i.e., causing a third-party or another to energize or otherwise receive energy in the antenna while moving the platform). Comparing the actual antenna response voltage of the at least one antenna on the platform occurs while the platform is moving, wherein movement of the platform occurs subsequent to stationary calibration of the at least one antenna prior to installation of the at least one antenna on the platform.

This exemplary method or another exemplary method may further provide effecting the installation of a plurality of antennas on the platform, and wherein the at least one antenna is from the plurality of antennas (i.e., causing a third-party or another to install the antennas on the platform). This exemplary method or another exemplary method may further provide effecting the installation of at least two antennas on the test fixture, wherein the at least two antennas are symmetrical and balanced relative to the test fixture, wherein balanced installation of the at least two antennas is adapted to improve accuracy of calibration data (i.e., causing another to install the two antennas in this manner). This exemplary method or another exemplary method may further provide effecting the installation of the at least one antenna on the test fixture; and effecting a measurement of the actual antenna response voltage of at least one antenna installed on the test fixture, wherein the actual antenna response voltage is measured based, at least in part on, the known frequency of the test signal from the known location. This exemplary method or another exemplary method may further provide accounting for physical nuances in the at least one antenna installed on the test fixture when the measurement of the actual antenna response voltage of the at least one antenna installed on the test fixture is performed.

In yet another aspect, an exemplary embodiment of the present disclosure may provide a method for antenna calibration comprising: effecting the installation of at least one antenna on a test fixture; effecting a measurement of an actual antenna response voltage of at least one antenna installed on the test fixture, wherein the actual antenna response voltage is measured based, at least in part on, a known frequency of a test signal from a known location; predicting, via CEM, a predicted antenna response voltage of the at least one antenna installed on the test fixture utilizing CEM inputs of the known frequency and the known location; determining a ratio of the actual antenna response voltage to the predicted antenna response voltage of the at least one antenna installed on the test fixture; predicting, via the CEM, a second predicted voltage when the at least one antenna is installed on a platform; multiplying the ratio of the actual antenna response voltage to the predicted antenna response voltage of the at least one antenna installed on the test fixture with the second predicted voltage of the at least one antenna installed on a platform to generate calibration data of the at least one antenna; constructing a calibration database of calibration data; effecting the removal of the at least one antenna from the test fixture and thereafter effecting the installation of the at least one antenna on the platform; and effecting direction finding (DF) of an angle to a signal source relative to and detected by at least some of the plurality of antennas based, at least in part, on the calibration data. This exemplary embodiment or another exemplary embodiment may further include effecting another to install a plurality of antennas on the platform, and the at least one antenna is from the plurality of antennas. This exemplary embodiment or another exemplary embodiment may further include effecting another to install at least two antennas on the test fixture, wherein at least two antennas are symmetrical and balanced relative to the test fixture, wherein balanced installation of the at least two antennas is adapted to improve accuracy of calibration data. "Balanced" here implying installation symmetry with respect to the test fixture or sufficient separation of the antennas from the edge of the fixture or appropriate edge current termination of the test fixture. This exemplary embodiment or another exemplary embodiment may further include accounting for physical nuances in the at least one antenna installed on the test fixture when the measurement of the actual antenna response voltage of the at least one antenna installed on the test fixture is performed. This exemplary embodiment or another exemplary embodiment may further include inputting a digital representation of physical characteristics of the test fixture into the CEM model prior to predicting the predicted antenna response voltage of the at least one antenna installed on the test fixture.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

Figure 1A:
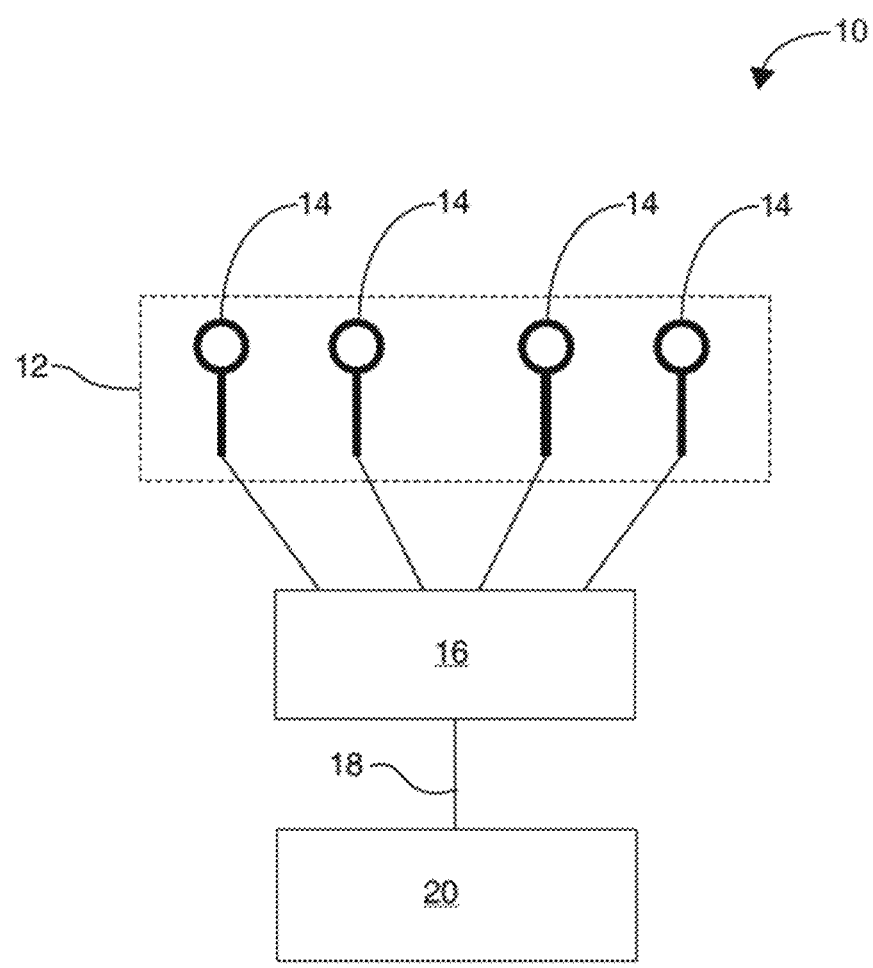
FIG. 1A (FIG. 1A) is a schematic view of a single linear array system according to one aspect of the present disclosure.
Figure 1B:
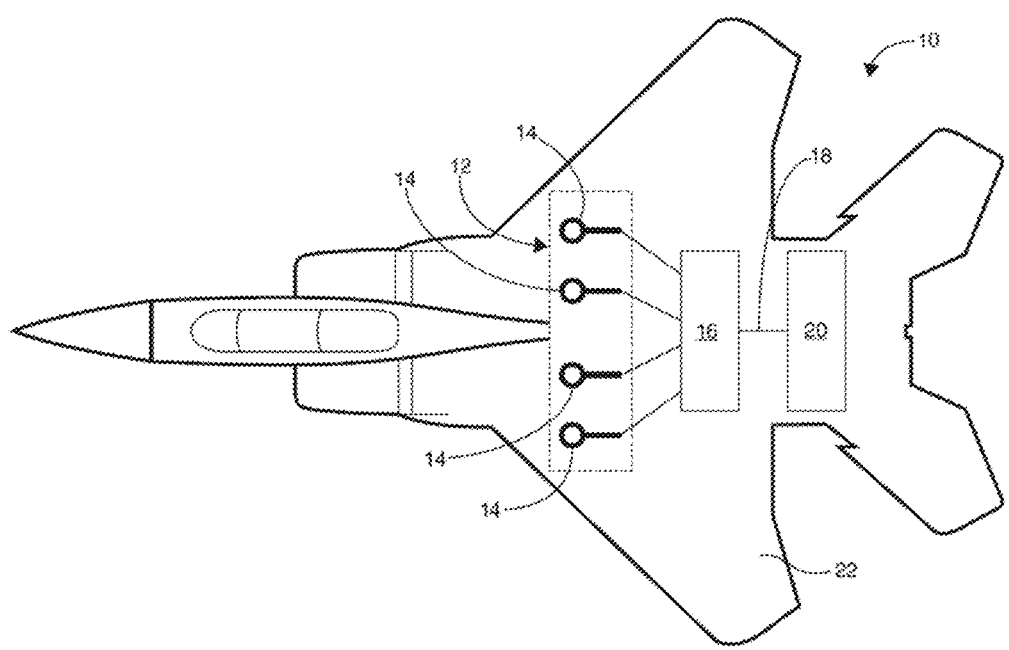
FIG. 1B (FIG. 1B) is an overhead schematic view of a single linear array system installed on a platform according to one aspect of the present disclosure.
Figure 2A:
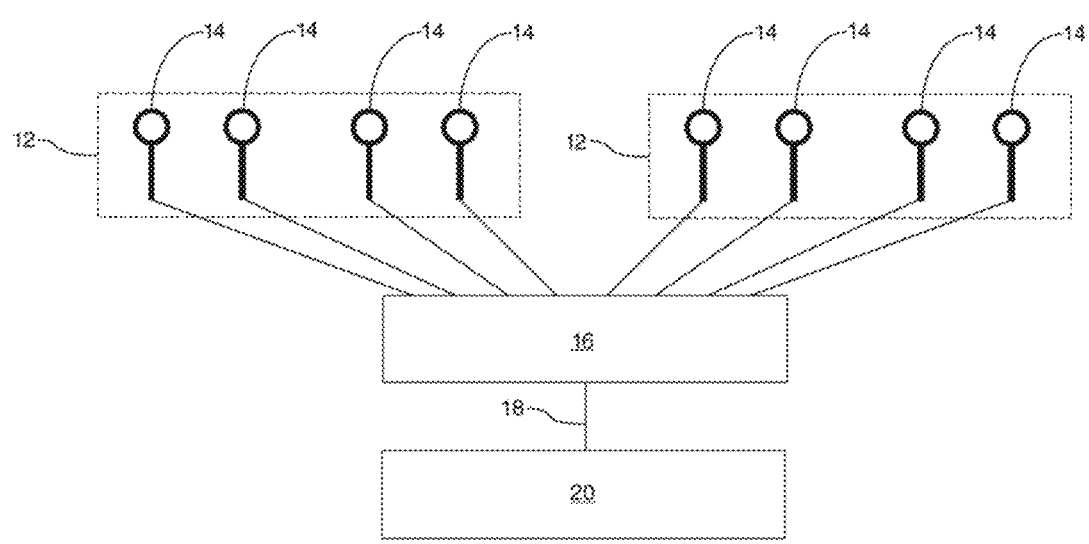
FIG. 2A (FIG. 2A) is a schematic view of a dual orthogonal linear array system according to one aspect of the present disclosure.
Figure 2B:
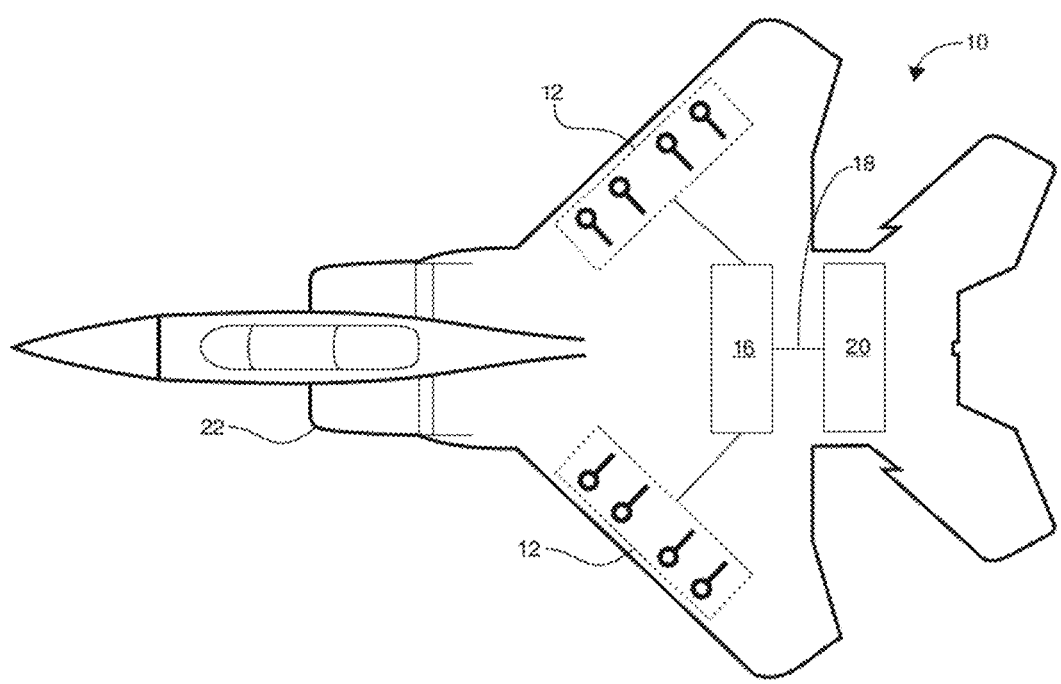
FIG. 2B (FIG. 2B) is an overhead schematic view of a dual orthogonal linear array system installed on a platform according to one aspect of the present disclosure.
Figure 3A:
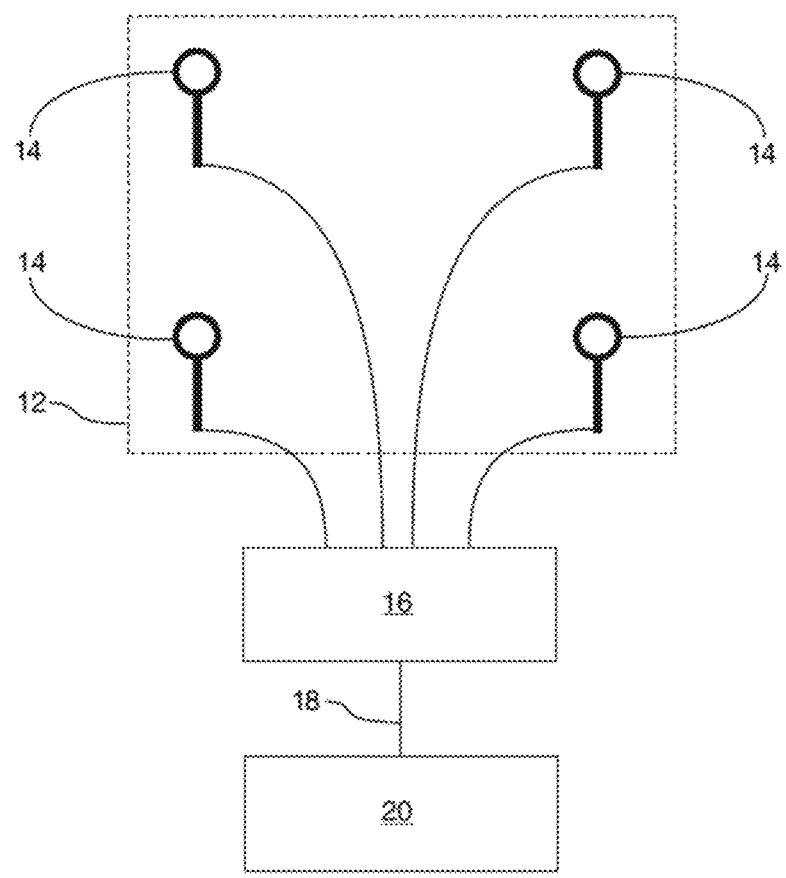
FIG. 3A (FIG. 3A) is a schematic view of a quadrant wing/tail array system according to one aspect of the present disclosure FIG. 3B (FIG. 3B) is an overhead schematic view of a quadrant wing/tail array system installed on a platform according to one aspect of the present disclosure.
Figure 3B:
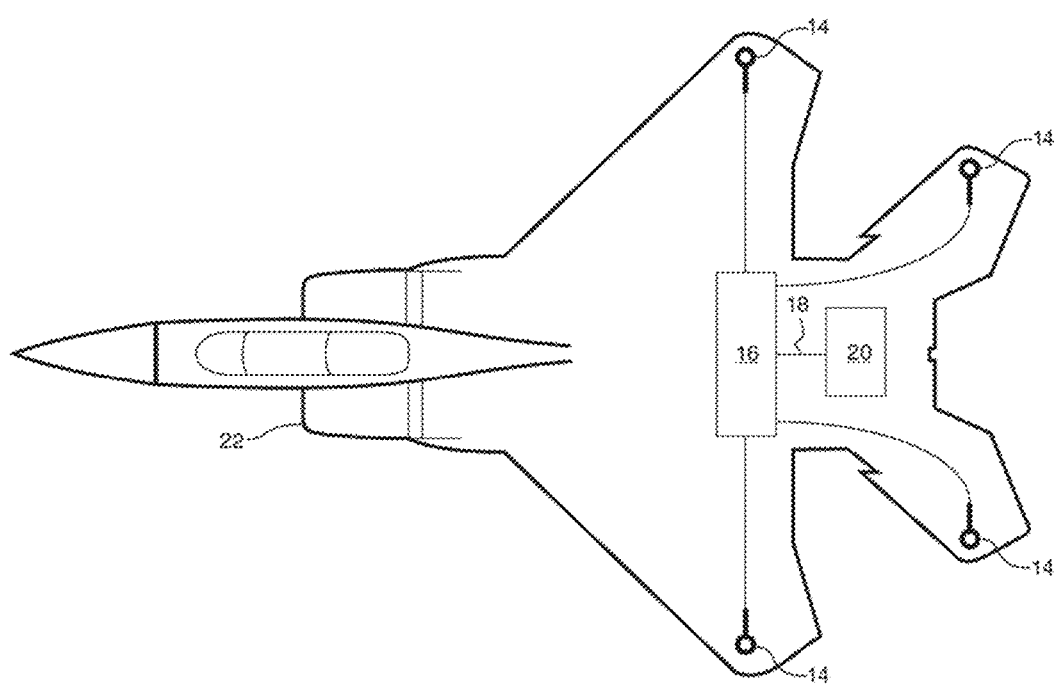

With reference to FIGS. 1A-3B, a direction finding (DF) system is shown and generally indicated at reference 10. DF system 10 may include one or more antenna arrays 12 including one or more antennas 14, a receiver 16, at least one output 18, and a processor 20. As depicted in FIGS. 1B, 2B, and 3B, DF system 10 may be installed on a platform 22 which is depicted and discussed herein as an aircraft; however, DF system 10 may be installed on a variety of platforms 22 as discussed further herein.

Antenna arrays 12 may include one or more antennas 14 in any configuration and may be installed in any position on platform 22. For example, as depicted in FIGS. 1A and 1B, a single antenna array 12 may be installed on the body of platform 22 and may be arranged with four antennas 14 in a single linear array configuration. Alternatively, as depicted in FIGS. 2A and 2B, two or more antennas 12 may be installed on platform 22, such as on each wing of an aircraft as depicted therein, and each antenna array 12 may have four or more antennas 14 arranged in a dual orthogonal linear array configuration.

With reference to FIGS. 3A and 3B, antenna array 12 may include four or more antennas 14 that are installed on platform 22 in a quadrant pattern such as depicted in FIG. 3B with one antenna 14 installed on each wing and each side of the tail of an aircraft as shown therein. These various configurations will be discussed further herein with reference to the operation of DF system 10.

Antennas 14 may be monopole, dipole, or directional antennas or any combination thereof and may be arranged in any desired configuration appropriate for their installation conditions. Although discussed predominantly herein in either linear arrangements or quadrant arrangements, antennas 14 may have any desired configuration, including existing legacy configurations, on platform 22 as dictated by the specific installation parameters and the type of platform 22 used. For example, one particular antenna 14 arrangement may work better for a particular platform with another antenna 14 arrangement being better suited for a different platform. By way of one further non-limiting example, an attack aircraft may be better suited for a particular antenna 14 arrangement while a reconnaissance aircraft may find advantages with different or multiple antenna array 12 arrangements.

Receiver 16 may be a computer or processor or alternatively a computing system that can store and/or execute the process or processes disclosed herein. According to one example, the receiver 16 may be a digital receiver that processes digital signals. According to another example, the receiver 16 may be an analog receiver that processes signals in the analog domain wherein such signals are converted to the digital domain for further processing as discussed herein. Alternatively, receiver 16 may be an intermediary between antenna array 12 and processor 20. According to this aspect, receiver 16 can have a direct connection to processor 20 via the at least one output 18.

Output 18 may be a direct wire connection between receiver 16 and processor 20 that can allow unidirectional or bidirectional communications therebetween. According to another aspect, output 18 may be a wireless datalink between receiver 16 and processor 20 utilizing any suitable wireless transmission protocol.

Processor 20 may be a computer, a logic controller, a series of logics or logic controllers, a microprocessor, or the like that can store and/or execute the process or processes disclosed herein. According to one aspect, processor 20 may further include or be in communication with at least one storage medium. According to one aspect, receiver 16, at least one output 18, and processor 20 may be contained within a single unit and, in connection with the at least one storage medium, can store and/or execute the process or processes disclosed herein. According to another aspect, receiver 16 may be remote from processor 20 and in communication therewith.

Receiver 16 and/or processor 20 may further be in communication with other systems on board the platform 22 such that relevant data may be communicated therebetween. For example, where platform 22 is an aircraft, onboard flight systems may relay data to the receiver 16 and/or processor 20 such as heading, altitude, flight speed, geolocation, and the like. Similarly, receiver 16 and/or processor 20 may communicate data regarding detected signals, DF results and the like to the platform 22, including to the operator or operators thereof. Data regarding detected signals or DF results and the like that is communicated to the platform 22 and/or to an operator thereof, may allow responsive actions to be taken by platform based on the DF of the location of the signal source. For example, an unmanned aircraft, such as a drone or a guided munition, may take automated actions such as steering towards the signal (as in a targeting situation), steering away from the signal (as in evasive maneuvers), jamming the signal, deploying defensive countermeasures, or any other appropriate responsive action. A manned aircraft may take similar responsive action through automatic response systems (such as deploying countermeasures) or may allow the operator/pilot of the aircraft to choose whether or not to employ any appropriate responsive actions.

Platform 22 may be a vehicle, person-portable, or stationary installation (i.e., a fixed/non-moveable structure) of any type. According to one aspect, as discussed and depicted herein, when platform 22 is an aircraft, it may be either manned or unmanned, including fixed wing and/or rotary aircraft. According to another aspect, platform 22 may be a munition, rocket, or other propelled vehicle. Platform 22 may further be a sea-based or land-based vehicle or fixed non-moveable installation (i.e., a building or tower).

Having thus described the general configuration and components of DF system 10, the calibration thereof and the method of use for calibrating the antennas prior to installation on platform 22 is discussed.

Figure 4:
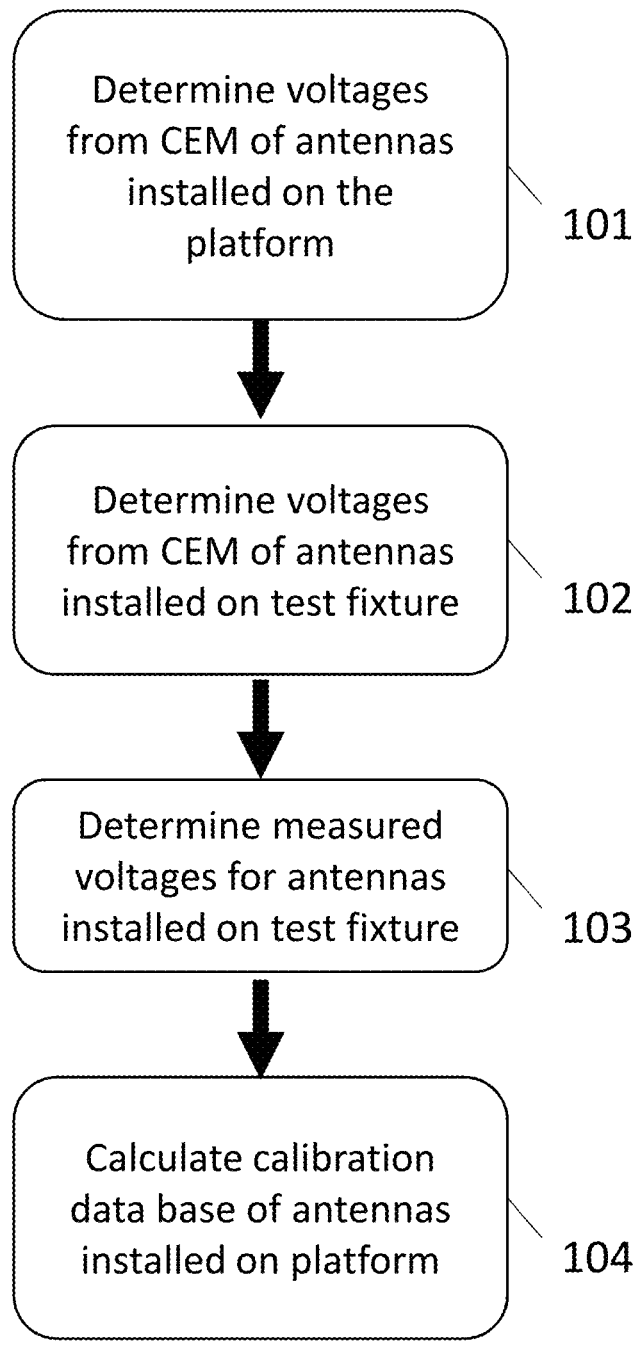
FIG. 4 (FIG. 4) is a flow chart depicting an exemplary process of calibrating an antenna according to one aspect of the present disclosure.

FIG. 4 is a flow chart that depicts an operational process for a method of DF antenna array calibration using the techniques described herein. Initially, at box 101, the method of the present disclosure obtains predicted voltages from at least one, a few, some of, or each antenna element that are representative of what an antenna would measure or its response voltage from a signal source at various angles/distances from the antenna and various frequencies. The predicted voltages or voltage responses are obtained from a CEM technique of the modeled antennas installed on a modeled platform. Thus, at this box 101, the system obtains its best representation of how the antenna will respond based on its ideal design and performance on a platform. Then, creating a representation utilizing 3D CEM techniques having placed or accounted for those antennas at their desired locations in the computer model. This creates or generates results of predicted voltages that would be expected to be seen at each respective antenna at a given location on the platform. For example, a designer can place digital representations of the antenna elements at various positions on a platform, such as an aircraft. Then, the designer may utilize test signal sources in the CEM model to represent signal sources that would be expected to be experienced by the antennas when deployed on the platform.

For example, the system designer can utilize computer modeling of signal source frequencies that represent hostile threats to the platform in a hostile environment. In one particular embodiment, the system designer may utilize a CEM model to generate a signal source representative of transmission frequencies that would generate response voltages on the modeled antennas indicative of an enemy signal transmission, the frequencies of which would be known to the system designer in advance. Alternatively, artificial intelligence and predictive learning techniques could be utilized to develop which signal sources and voltages can be implemented within the system.

At box 102, the voltages are obtained from CEM techniques of the antennas as installed on the antenna range test fixture. This effectively repeats the process that occurs at box 103 but with the ideal CEM techniques of the antennas from box 101. Effectively, the technique is trying to replicate the fixture measurement from box 103 by obtaining the voltages using CEM techniques.

At box 103, the actual voltage measurement of the antenna is determined. This determination accounts for the nuances of the antenna when the antenna is mounted on a fixture during or shortly after manufacture to confirm operation of the antenna. The actual voltages may be measured at an antenna range in a simple test fixture, such as a test plate. This is often performed at low cost and fairly quickly by the antenna manufacturer but could be performed by another entity. It is possible for the system designer to perform the test voltages representing the antenna signal response. Alternatively, in another exemplary embodiment the antenna manufacturer conducts the actual test response and provides the system designer with this information. The system designer then incorporates these voltages representing the actual test responses into the system and method.

As stated previously, the ratio of the actual antenna voltages on a test fixture to the modeled antenna voltages from on a model of a fixture is multiplied by the modeling on the platform to obtain a calibration of the antennas on the platform. Stated otherwise, the measured antennas on the test fixture (box 103) are divided by the CEM of the antennas on the test fixture (box 102) and multiplied by the CEM of the antennas on the platform (box 101) to obtain the calibration of the antennas on the platform. This effectively puts the attributes of the measured antenna into the calibration equation of the CEM techniques of voltages obtained for the antenna on the platform. Stated otherwise, this technique effectively replicates the nuances of each respective antenna element and then cancels out the test fixture from which those nuances were obtained.

The equation representing the foregoing is:

$$Cal_{Antennas\ on\ Platform} = CEM_{Antennas\ on\ Platform} * \frac{Measured_{Antennas\ on\ Test\ Fixture}}{CEM_{Antennas\ on\ Test\ Fixture}}$$

The voltages represent the responses of a particular antenna when subjected to a test signal from a known location. For example, if a known signal source is provided at a distance and angle away from the antenna on the test fixture and the signal is propagated from the source at a known frequency, then the antenna on the test fixture will exhibit a voltage in response to receiving said signal. For this example, assume that the test source was provided at a known distance and angle from the test fixture and antenna at a known frequency. If the antenna response with a voltage at, for example, $1.2e^{j\pi/2}$ volts, then this value will represent the measured voltage of the antenna on the fixture.

Continuing with this example, the aspects of the present disclosure may include logic to predict, via CEM, the voltages from the same antenna installed on the test fixture. Within the CEM model, the system will be provided with one or more of the same distance, angle, polarization and signal frequency of the test signal source. The CEM will use these parameters to input in the CEM model what voltage the antenna on the test fixture should exhibit in response to a modeled signal. If the predicted CEM model of the antenna on a test fixture exhibits a response voltage of say, for example, $1e^{j\pi}$ volt, then the ratio of the measured voltage of the antenna on the test fixture over or to the CEM model voltage of the antenna on the fixture would be $1.2_{j\pi 2}/1e^{j\pi}$ or $(1.2/1)e^{-j\pi/2}$. Obtaining the ratio of the measured antenna voltage on the test fixture to the CEM modeled voltage of the antenna on the test fixture may be determined by logic in the system.

The system may include additional logic to predict via CEM, the response voltages of the at least one antenna when installed on a platform, not the test fixture. If, for example, the CEM model of the antenna on the platform is input with a modeled signal frequency at a known angle relative to the antenna, and with those parameters the CEM model of the antenna on the platform produces a voltage response to that signal of $0.5e^{j3\pi/4}$ volts, then the $0.5\ e^{j3\pi/4}$ volts is multiplied by the ratio of $(1.2/1)e^{-j\pi/2}$ to obtain the calibrated and expected response of the antenna on the platform when subjected to the signals with the parameters input into the CEM model for the antenna on the platform. In this particular example, the calibration of the antenna on the platform would equal $0.6e^{j\pi/4}$ volts ($0.5\ e^{j3\pi/4}$ volts×$1.2\ e^{-j\pi/2}$ volts). The $0.6e^{j\pi/4}$ volts would then be stored into a database. The system may utilize logic to generate this calibration database of calibration data from the antenna installed on the platform. Then, the system will utilize additional logic to utilize the calibration data within the database to determine a signal source angle of arrival or location when the platform is in actual use. For example, the antennas may be installed on the platform and the system will know that when the antenna on the platform experiences a response voltage of $0.6e^{j\pi/4}$ volts, along with the other antenna response voltages, then the signal source will be at the same angular or spatial location from the platform at a given frequency because the known characteristics and nuances of the antenna will have been accounted for during the calibration.

Calibrating the antenna within a CEM model utilizing the known measurements when the antenna was on the test fixture will allow a quick and low cost calibration technique to be employed prior to installing the antennas on the platform and eliminate the need for high cost and intensive platform calibration that ordinarily requires flying or otherwise maneuvering the platform or transmitter for extended periods of time and subjecting the same to a plethora of signals in order to account for the nuances of the antenna when installed on the platform.

Alterative to the process or method identified in FIG. 4, the present disclosure can also be fully embodied or fully conceptualized via CEM. For example, the computer electromagnetic modeling could be utilized to simulate the measured voltages of antennas installed on the antenna range test fixture that were previously represented by Box 102. For example, the CEM can be utilized to input the nuances for particular antenna arrays. Thus, computer electromagnetic modeling could be used for everything but the modeling can be input with variables that intentionally represent nuances associated with the measured voltages of antennas installed on the test fixture.

Some exemplary performance comparisons are shown in the following slides and figures that represent signal parameters compared to the different approaches for calibration and why the present disclosure provides an accurate and low cost calibration that is sufficiently accurate but at a lower cost alternative and therefore is a practical application and an improvement over the prior art. The signal parameters used for modeling the present disclosure presume an azimuth angle of zero degrees to 360 degrees and a zero degree elevation. The parameters also include ten degrees one standard deviation of phase measurement error and a 1.4 decibel (dB) measurement amplitude error.

Figure 5:
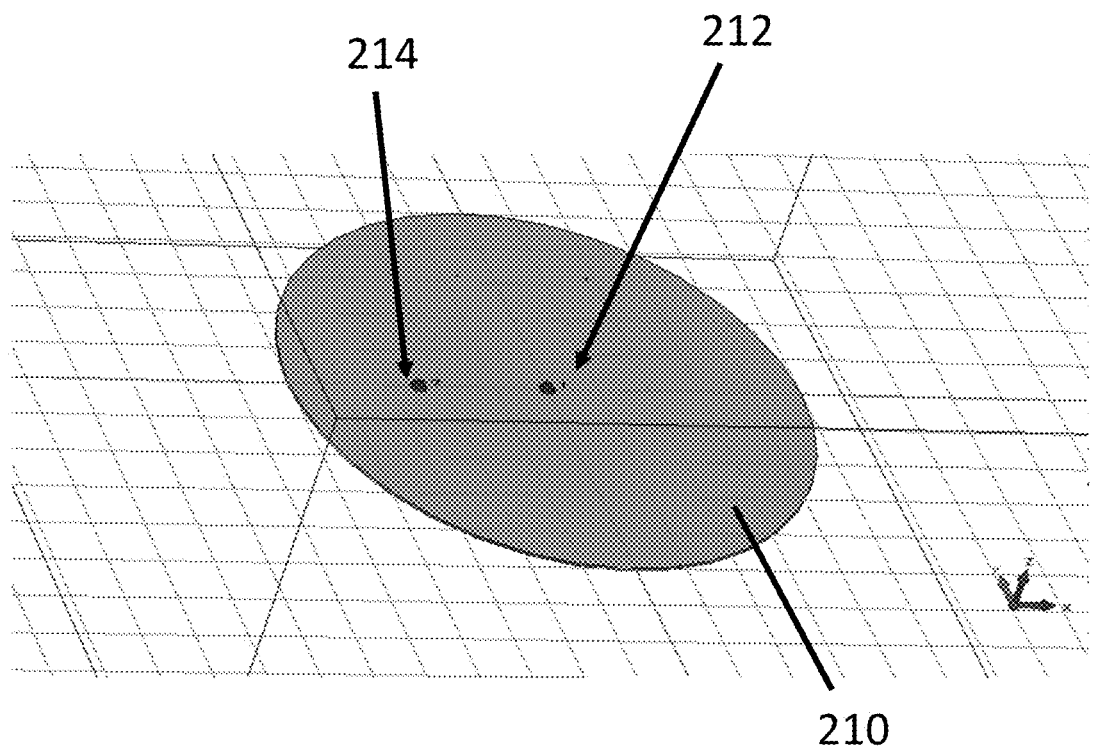
FIG. 5 (FIG. 5) is a diagrammatic view of a reference antenna and another antenna installed on an exemplary test fixture according to one aspect of the present disclosure.

FIG. 5 represents an exemplary test fixture 210 having at least one antenna thereon. More particularly, FIG. 5 depicts an exemplary test fixture 210 with a plurality of antennas wherein the at least one antenna is one of the plurality. There is a first antenna 212 centered on the test fixture 210 and a second antenna 214 off center or eccentric to the central axis of the test fixture 210. Each of these exemplary antennas are monopole antennas. Although the test fixture 210 is shown to be circular that does not need to be the case and the test fixture may take on any shape or configuration. Each antenna has a feed point that couples the antenna to the test fixture. The first antenna 212 central in the test fixture may be considered as a reference antenna and the second antenna 214 may be a secondary antenna. Each of these represents a computer electromagnetic model of antennas on the fixture. For example, when this is performed by a supplier, a supplier would place two antennas on a plate and measure their performance characteristics.

The antennas described herein may be any type of antenna capable or desired to be used in direction finding capabilities. One exemplary DF capable antenna is a broadband Archimedean spiral antenna. Other exemplary antennas include Vivaldi notch antennas or horn antennas. Thus, one skilled in the art would easily recognize that any type of antenna could be utilized with the system and method of the present disclosure.

Figure 6:
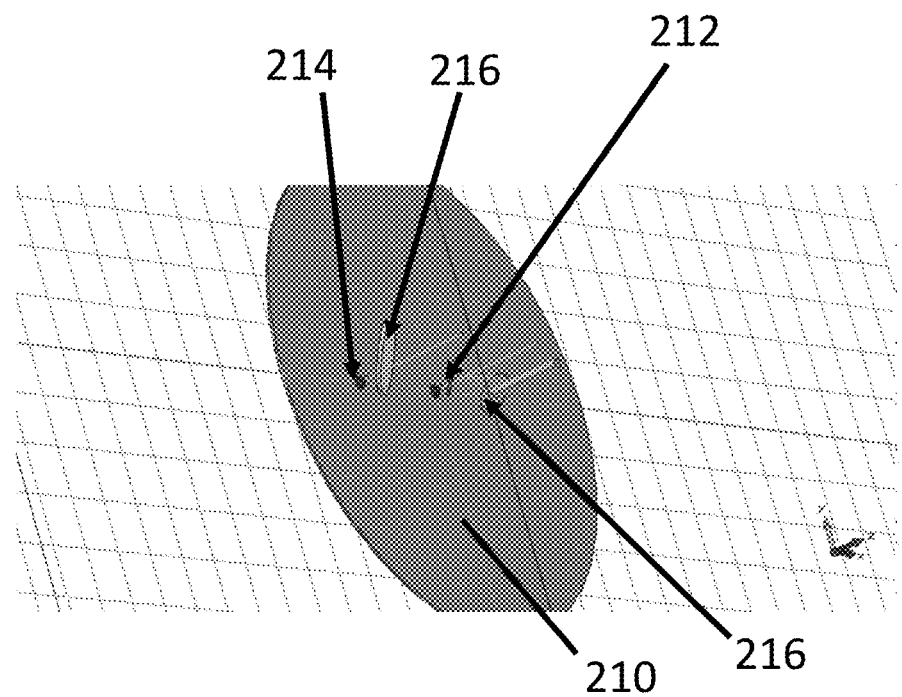
FIG. 6 (FIG. 6) is a diagrammatic view of a reference antenna and another antenna installed on a test fixture with additional elements representing nuances that effect antenna operation according to one aspect of the present disclosure.

FIG. 6 represents different antennas on a test fixture. As indicated previously, the system of the present disclosure accounts for the unique nuances of each individual antenna element. To represent those nuances, metal appendages 216 provide input nuances into the CEM to represent nuances that would affect the performance characteristics of the measured antenna voltages.

Figure 7:
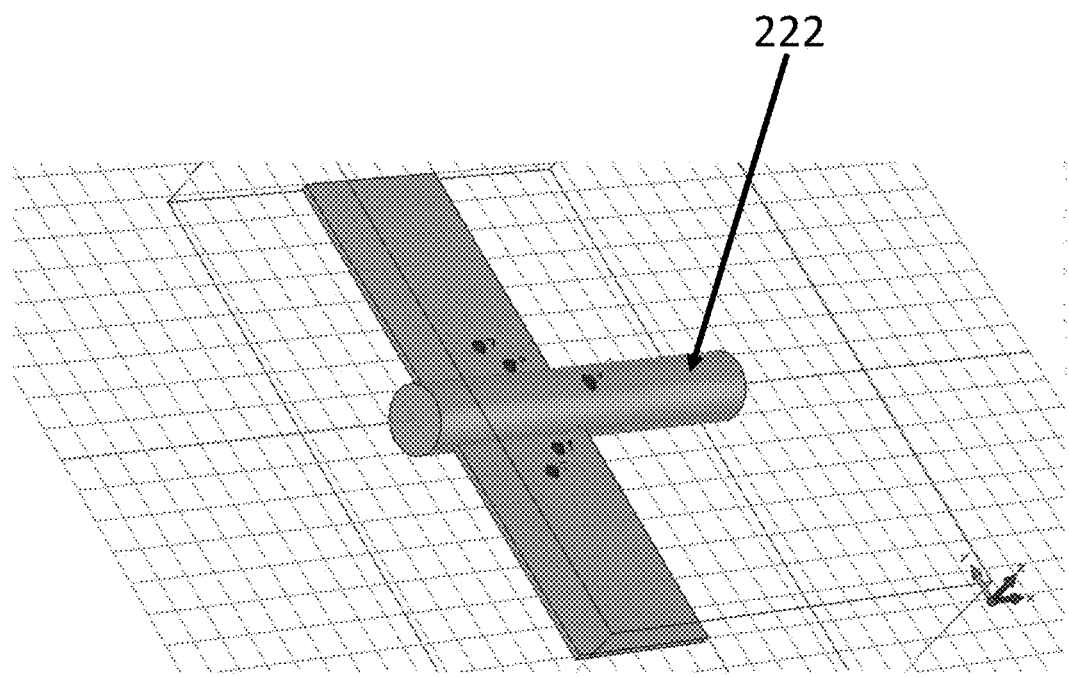
FIG. 7 (FIG. 7) is a diagrammatic view of a plurality of antennas installed on an exemplary platform that need to be calibrated according to one aspect of the present disclosure.

FIG. 7 represents a computer electromagnetic model of a platform, or modeled platform 222, which is generally the configuration of an airplane; however, it may be any other moveable or stationary structure, containing any number of antennas installed thereon. The frequencies of these antennas or the plurality of antennas on this platform or aircraft resonate. The antennas are placed in or installed on a wing or fuselage of modeled platform 222 that would receive reflections of the signals from the fuselage. These represent intricacies that are common in real life applications. This example provides an array that has single correlated DF values having done so by keeping the array small: having a minimum spacing distance of less than ½ wavelength (½ λ) between the antennas.

Figure 8:
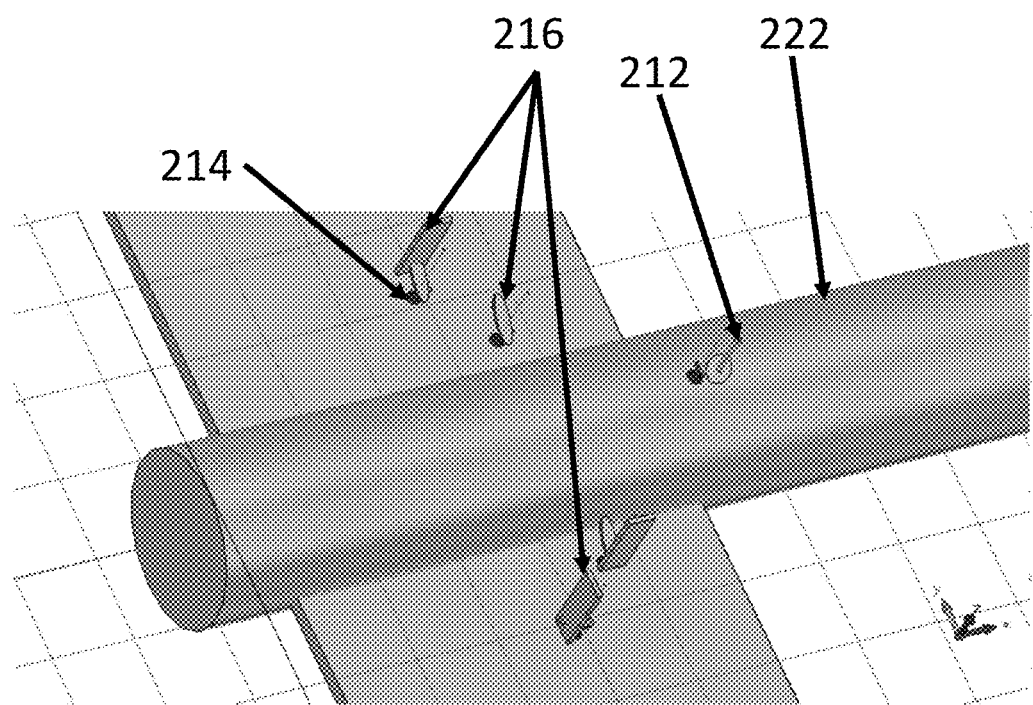
FIG. 8 (FIG. 8) is a diagrammatic view of a plurality of antennas installed on an exemplary platform with additional elements representing nuances that effect antenna operation according to one aspect of the present disclosure.

FIG. 8 is a model representation of what measured antennas might experience on the modeled platform 222, such as an aircraft. FIG. 8 includes various appendages that are modeled to represent nuances in antenna operation that account for various noise and disturbances that would affect antenna performance. Thus FIG. 7 represents current attempts for CEM modeling of antennas on a platform whereas FIG. 8 represents the actual measurements or the actual measured voltages of the antennas on a platform. Thus, the measured antennas on a test fixture divided by the CEM predicted measurements of the antennas on a text fixture multiplied by the CEM predicted measurements of the antennas on the platform represent the measured voltages of the antennas on the platform.

In one exemplary embodiment, the system and method of the present disclosure utilizes calibration databases that contain the antenna response voltages (which can be converted to amplitude and phase values) for all the antennas in an array for all azimuth and elevation angles and all frequencies. During operation, when a signal with a certain frequency is measured, the antenna voltages that are measured are correlated, or compared, with the sets of stored antenna voltages at each of the azimuth and elevation angles associated with those voltages. This is only done with the voltages stored for the calibration frequency that is closest to the measured frequency. So, the database has stored with each set of antenna voltages, the associated azimuth and elevation angles. The azimuth and elevation angles that have the highest calculated correlation value, or degree for favorable comparison, is reported as the azimuth and elevation angle of arrival.

Figure 9:
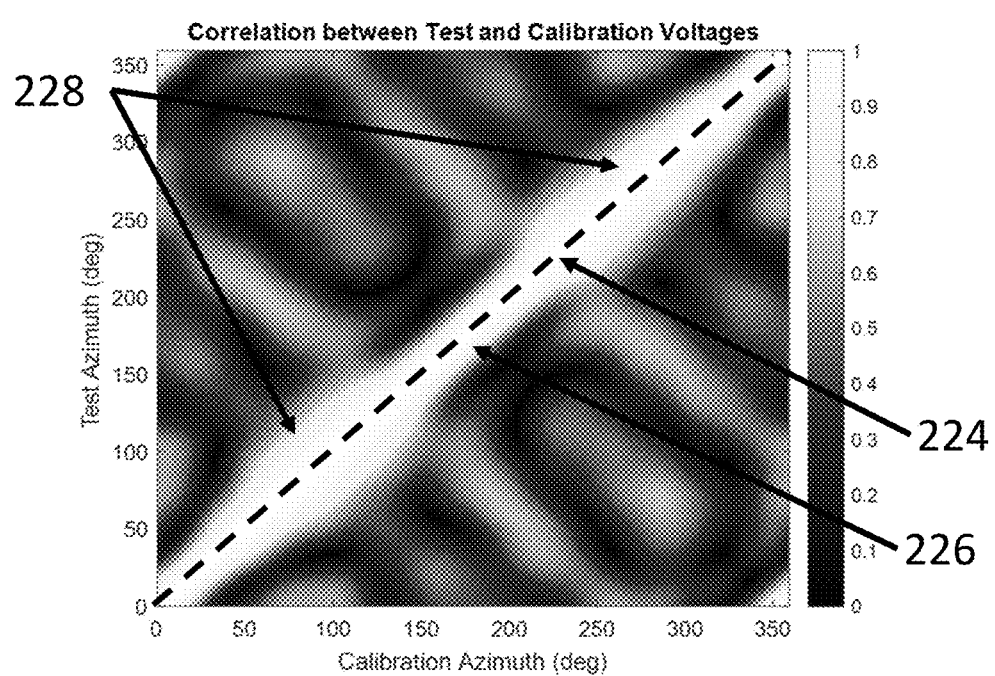
FIG. 9 (FIG. 9) is a graph depicting a correlation between test voltages and calibration voltages.

FIG. 9 depicts the correlation between the test voltages and the calibration voltages with the test azimuth being shown on the vertical axis and the calibration azimuth shown on the horizontal axis. The diagonal dashed line 224 represents the ideal correlation between the test voltage and the calibration voltage. The test voltages are derived from the model in FIG. 8, while the calibration voltages are derived from the measured antennas on a test fixture divided by the CEM predicted measurements of the antennas on a text fixture multiplied by the CEM predicted measurements of the antennas on the platform.

As shown in the correlation graph of FIG. 9, the correlation value peaks where the test azimuth equals the calibration azimuth represented by dashed line 224. In one particular embodiment, when the antenna array is wider than it is deep or long, then the correlation pattern indicates that at zero degrees and 180 degrees is more accurate and narrower, as shown by region 226. However, at 90 degrees and 270 degrees, the correlation pattern is slightly wider, as shown by region 228. This means that when the signal source is broadside, then the correlation pattern is a little wider than if the signal was an end-fire signal. Stated otherwise, if the DF error was observed as a function of 360 degrees, it is most accurate at the nose and tail of the platform and least accurate at the broadside (i.e. left wing or right wing) directions.

Table 1 (below) depicts values that indicate that a balanced test fixture 210 installation improves accuracy. For the data results of the Table 1, each antenna 212, 214 was projected into a perfect calibration, one at a time to isolate impact on performance. In this particular example, a perfect calibration would result in very small error and a correlation near one. If the reference antenna is replaced with the antenna having nuances 216 incorporated therein, then Table 1 indicates that the error does not deviate far from the norm. In other words, the nuanced antenna is projected into a perfect calibration and indicates that the DF error is relatively low and the correlation is still high. Particularly, for the reference antenna, a RMS DF error of 0.45 is relatively small. For the other antennas, such as antenna 2—antenna 4, which may not have significant characteristic differences from the test antenna (i.e., antenna 1), but are located near the edge of the ground plane, then there might be slightly larger errors yet still within the realm of accurate measurements. However, in real world applications, one would typically not put a small antenna asymmetrically close to the edge of a ground plane and that may account for the slightly elevated RMS DF error.

TABLE 1

| Antenna Projected | RMS DF Error (°) | Comments |
| --- | --- | --- |
| Reference | 0.45 | Center Mount on Ground Plane |
| Antenna 2 | 1.38 | Edge Mount on Ground Plane |
| Antenna 3 | 0.94 | Edge Mount on Ground Plane |
| Antenna 4 | 0.94 | Edge Mount on Ground Plane |

Table 2 (below) indicates that the calibration system and method of the present disclosure depicts a high correlation value for the average peak, the mean DF error, 68 percent DF error, 90 percent DF error, and RMS DF error being statistically similar to the platform performed flight calibration measurements. Thus, Table 2 indicates that the present disclosure properly correlates and enables accurate low cost calibration of antennas on the platform 22. The flight calibration utilizes a 14 degree phase error and a 2.1 dB amplitude error because that is what the root sum square of two 10 degree phase errors and two 1.4 dB amplitude errors are, respectively. This incorporates the fact that for flight calibration, the aircraft or platform must be flown once to calibrate the system, incurring measurement errors, and again during operation. This is different from the calibration system of the present disclosure which only utilizes one set of measurements that are associated with operational flights. Small measurement errors are incurred during the antenna range fixture measurements, but those are considered small and not included in the results.

TABLE 2

| Parameter | Calibration System, 10° Phase Error, 1.4 dB Error | Platform Flight Calibration, RSS Calibration and Operational Measurements: 14° Phase Error, 2.1 dB Error |
| --- | --- | --- |
| \| R \| (Avg Peak) | 0.985 | 0.9845 |
| Mean DF Error (°) | 0.39 | 0.22 |
| 68% DF Error (°) | 2.77 | 2.84 |
| 90% DF Error (°) | 5.33 | 4.95 |
| RMS DF Error (°) | 3.1 | 3.09 |

As shown in Table 2, the DF accuracies for the system of the flight calibration system and for the method of the present disclosure are statistically equivalent. Particularly with respect to the average peak correlation, the calibration system and method of the present disclosure is within 0.05% of the platform flight operational measurements. With respect to the RMS DF error, the calibration system and method of the present disclosure is within 0.3% of the platform flight operational measurements The system and method disclosed herein provides a practical application implemented through an improved process to solve the existing application specific problems of associated with antenna calibration. The practical application of the system and method of the present disclosure provides an improved manner of calibrating said antennas by rapidly increasing antenna calibration time while simultaneously decreasing costs associated with antenna calibration by implementing the calibration technique discussed herein. Effectively, the system of the present disclosure is adjusting calibration voltages to be more accurate and to be less costly to obtain. If calibration was done by using a simple fixture, the accuracy is improved by adding full platform effects from the CEM modeling. If the calibration is performed by CEM modeling of the platform, it is more accurate by including antenna measurements. The system and method of the present disclosure is less costly than if calibration is done by flying a platform.

The system and method of the present disclosure has been presented as a process that is multiplying complex voltages. However, it would be apparent to one skilled in the art that a system and method could also primarily look at the process as adding or subtracting phase values (when the exponential components of the voltages get multiplied or divided, it is the same thing as adding or subtracting the phase) to achieve the calibration. Also, sometimes magnitude is addressed in decibels (dB), wherein multiplying or dividing voltages is equivalent to adding or subtracting magnitudes in dB. In other words, an alternative manner to achieve the objectives of solving for (i) an actual antenna response voltage of the at least one antenna on a test fixture, (ii) a first predicted antenna response voltage of the at least one antenna on the test fixture, and (iii) a second predicted antenna response voltage of the at least one antenna on a modeled platform could look at the same process as correcting the calibration values by adding/subtracting phases and magnitudes.

In one particular embodiment of the present disclosure, voltage measurements or values are obtained relative to a reference measurement or value. In other words, if a measurement is made, said measurement is made relative to a reference channel, either from another antenna in the DF array (i.e. the reference antenna), or sometimes the transmit signal generated from antenna range test equipment that will split the transmitted signal. When split, one channel goes directly to the reference channel of the receiver via a cable and the other channel goes to the transmit antenna, then to a receive antenna on the test fixture, then to a cable, then to a measurement channel of the receiver. This is practical to the test fixtures having two antennas. In this scenario, one is the reference antenna and the other is the measurement antenna. This is needed to obtain usable voltage values.

In another particular embodiment, although there can be one antenna on a platform, there needs to be at least two distinct channel outputs to be able to perform DF. As such, an embodiment of the present disclosure may measure a single antenna on a test fixture (relative to a reference antenna) and CEM model antenna responses can be obtained in the same way. Then, the system may use a ratio of the single antenna relative to the reference antenna to improve the accuracy of that single antenna in a DF array.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

For example, one embodiment of the present disclosure may provide at least one non-transitory computer readable storage medium comprising instructions that, when executed by one more processors, is configured to perform a computer operation to calibrate an antenna for use on platform 22, the instructions comprising: instructions to calibrate at least one antenna for use in an antenna array on a platform, wherein the logic to calibrate the at least one antenna includes instructions to execute a calibration based, at least in part, on (i) an actual antenna response voltage of the at least one antenna on a test fixture, (ii) a first predicted antenna response voltage of the at least one antenna on the test fixture, and (iii) a second predicted antenna response voltage of the at least one antenna on a modeled platform; and wherein the instructions to calibrate the at least one antenna are executed prior to moving the platform 22 with the at least one antenna installed thereon or without moving the platform 22 after the at least one antenna is installed on the platform 22. The instructions may further comprise: instructions to predict, via CEM, a predicted antenna response voltage of the at least one antenna installed on the test fixture 210 utilizing CEM inputs of the known frequency and the known location; instructions to determine a ratio of the actual antenna response voltage to the predicted antenna response voltage of the at least one antenna installed on the test fixture 210; instructions to predict, via the CEM, a second predicted voltage when the at least one antenna is installed on a modeled platform; instructions to multiply the ratio of the actual antenna response voltage to the predicted antenna response voltage of the at least one antenna installed on the test fixture with the second predicted voltage of the at least one antenna installed on the modeled platform to generate calibration data of the at least one antenna; instructions to generate a calibration database of calibration data.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Additionally, another embodiment of the antenna calibration system of the present disclosure may provide logic to calibrate the at least one antenna 212 for use in an antenna array on platform 22, wherein the logic to calibrate the at least one antenna 212 includes instructions to execute a calibration based, at least in part, on (i) an actual antenna response voltage of the at least one antenna on the test fixture 210, (ii) a first predicted antenna response voltage of the at least one antenna 212 on the test fixture 210, and (iii) a second predicted antenna response voltage of the at least one antenna on the modeled platform 222; and wherein the logic to calibrate the at least one antenna 212 is executed prior to moving the actual platform 22. There may be logic to predict, via CEM, a predicted antenna response voltage of the at least one antenna 212 installed on the test fixture 210 utilizing CEM inputs of the known frequency and the known location of a modeled signal source. There may be logic to determine a ratio of the actual antenna response voltage to the predicted antenna response voltage of the at least one antenna 212 installed on the test fixture 210. There may be logic to predict, via the CEM, a second predicted voltage when the at least one antenna 212 is installed on the modeled platform 222. There may be logic to multiply the ratio of the actual antenna response voltage to the predicted antenna response voltage of the at least one antenna 212 installed on the test fixture 210 with the second predicted voltage of the at least one antenna 212 installed on the modeled platform 222 to generate calibration data of the at least one antenna. There may also be logic to generate a calibration database of calibration data.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein in the specification and in the claims, the term "effecting" or a phrase or claim element beginning with the term "effecting" should be understood to mean to cause something to happen or to bring something about. For example, effecting an event to occur may be caused by actions of a first party even though a second party actually performed the event or had the event occur to the second party. Stated otherwise, effecting refers to one party giving another party the tools, objects, or resources to cause an event to occur. Thus, in this example a claim element of "effecting an event to occur" would mean that a first party is giving a second party the tools or resources needed for the second party to perform the event, however the affirmative single action is the responsibility of the first party to provide the tools or resources to cause said event to occur.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A method for antenna calibration comprising:
   calibrating at least one antenna for use in an antenna array on a platform, wherein calibrating the at least one antenna includes executing a calibration including (i) an actual antenna response voltage of the at least one antenna on a test fixture, (ii) a first predicted antenna response voltage of the at least one antenna on the test fixture, and (iii) a second predicted antenna response voltage of the at least one antenna on a modeled platform; and
   wherein calibrating the at least one antenna occurs (a) prior to moving the platform with the at least one antenna installed thereon or (b) without moving the platform after the at least one antenna is installed on the platform.

2. The method of claim 1, wherein the first predicted antenna response voltage of the at least one antenna installed on the test fixture is obtained via a computer electromagnetic model (CEM) utilizing CEM inputs of a known frequency and a known location of a test signal source.

3. The method of claim 2, further comprising:
   inputting a digital representation of physical characteristics of the test fixture into the CEM model prior to predicting the first predicted antenna response voltage of the at least one antenna installed on the test fixture.

4. The method of claim 2, further comprising:
   determining a ratio of the actual antenna response voltage to the first predicted antenna response voltage of the at least one antenna installed on the test fixture.

5. The method of claim 4, wherein the second predicted antenna response voltage of the at least one antenna installed on the modeled platform is obtained via CEM when the at least one antenna is installed on the modeled platform.

6. The method of claim 5, further comprising:
   multiplying the ratio of the actual antenna response voltage to the first predicted antenna response voltage of the at least one antenna installed on the test fixture with the second predicted antenna response voltage of the at least one antenna installed on the modeled platform to generate calibration data of the at least one antenna.

7. The method of claim 6, further comprising:
   constructing a calibration database of the calibration data.

8. The method of claim 7, further comprising:
   effecting the removal of the at least one antenna from the test fixture and thereafter effecting installation of the at least one antenna on an actual platform having an antenna response voltage approximately equal to the predicted antenna response voltage of the modeled platform; and
   effecting direction finding (DF) of an angle to a signal source detected by at least some of the plurality of antennas based, at least in part, on the calibration data.

9. The method of claim 8, wherein effecting DF of the angle to the signal source is accomplished by comparing an actual antenna response voltage on the platform to the calibration data base, and correlating the actual antenna response voltage to the calibration data.

10. The method of claim 9, further comprising:
    effecting the at least one antenna to be energized from the signal source while the platform is moving to obtain the actual antenna response voltage of the at least one antenna on the platform; and
    wherein comparing the actual antenna response voltage of the at least one antenna on the platform occurs while the platform is moving, wherein movement of the platform occurs subsequent to stationary calibration of the at least one antenna prior to installation of the at least one antenna on the platform.

11. The method of claim 1, further comprising:
    effecting installation of the at least one antenna on the platform.

12. The method of claim 1, further comprising:
    effecting installation of at least two antennas on the test fixture, wherein the at least two antennas are symmetrical and balanced relative to the test fixture.

13. The method of claim 1, further comprising:
    effecting installation of the at least one antenna on the test fixture;
    effecting a measurement of the actual antenna response voltage of at least one antenna installed on the test fixture, wherein the actual antenna response voltage is measured based, at least in part, on a known frequency of a test signal from a known location.

14. The method of claim 13, further comprising:
    accounting for physical nuances in the at least one antenna installed on the test fixture when the measurement of the actual antenna response voltage of the at least one antenna installed on the test fixture is performed.

15. The method of claim 1, further comprising:
    effecting installation of the at least one antenna on the test fixture;
    effecting a measurement of the actual antenna response voltage of at least one antenna installed on the test fixture, wherein the actual antenna response voltage is measured based, at least in part, on a known polarization of a test signal from a known location.

16. An antenna calibration system comprising:
   logic to calibrate at least one antenna for use in an antenna array on a platform, wherein the logic to calibrate the at least one antenna includes instructions to execute a calibration including (i) an actual antenna response voltage of the at least one antenna on a test fixture, (ii) a first predicted antenna response voltage of the at least one antenna on the test fixture, and (iii) a second predicted antenna response voltage of the at least one antenna on a modeled platform; and
   wherein the logic to calibrate the at least one antenna is executed (a) prior to moving the platform with the at least one antenna installed thereon or (b) without moving the platform after the at least one antenna is installed on the platform.

17. The antenna calibration system of claim 16, further comprising:
   logic to predict, via a computer electromagnetic model (CEM), a predicted antenna response voltage of the at least one antenna installed on the test fixture utilizing CEM inputs of a known frequency and known location of a test signal;
   logic to determine a ratio of the actual antenna response voltage to the predicted antenna response voltage of the at least one antenna installed on the test fixture;
   logic to predict, via the CEM, a second predicted voltage when the at least one antenna is installed on the modeled platform;
   logic to multiply the ratio of the actual antenna response voltage to the predicted antenna response voltage of the at least one antenna installed on the test fixture with the second predicted voltage of the at least one antenna installed on the modeled platform to generate calibration data of the at least one antenna;
   logic to generate a calibration database of calibration data.

18. At least one non-transitory computer readable storage medium comprising instructions that, when executed by one or more processors, is configured to perform a computer operation to calibrate an antenna, the instructions comprising:
   instructions to calibrate at least one antenna for use in an antenna array on a platform, wherein the logic to calibrate the at least one antenna includes instructions to execute a calibration including (i) an actual antenna response voltage of the at least one antenna on a test fixture, (ii) a first predicted antenna response voltage of the at least one antenna on the test fixture, and (iii) a second predicted antenna response voltage of the at least one antenna on a modeled platform; and
   wherein the instructions to calibrate the at least one antenna are executed (a) prior to moving the platform with the at least one antenna installed thereon or (b) without moving the platform after the at least one antenna is installed on the platform.

19. The at least one non-transitory computer readable storage medium of claim 18, wherein the instructions further comprise:
   instructions to predict, via a computer electromagnetic model (CEM), a predicted antenna response voltage of the at least one antenna installed on the test fixture utilizing CEM inputs of a known frequency and known location of a test signal;
   instructions to determine a ratio of the actual antenna response voltage to the predicted antenna response voltage of the at least one antenna installed on the test fixture;
   instructions to predict, via the CEM, a second predicted voltage when the at least one antenna is installed on the modeled platform;
   instructions to multiply the ratio of the actual antenna response voltage to the predicted antenna response voltage of the at least one antenna installed on the test fixture with the second predicted voltage of the at least one antenna installed on the modeled platform to generate calibration data of the at least one antenna; and
   instructions to generate a calibration database of calibration data.

* * * * *